(12) United States Patent
Singh (10) Patent No.: US 8,781,764 B2
(45) Date of Patent: Jul. 15, 2014

(54) SYSTEM FOR DETECTING A SHORT CIRCUIT ASSOCIATED WITH A DIRECT CURRENT BUS

(75) Inventor: Brij N. Singh, West Fargo, ND (US)

(73) Assignee: Deere & Company, Moline, IL (US)

( * ) Notice: Subject to any disclaimer, the term of this patent is extended or adjusted under 35 U.S.C. 154(b) by 387 days.

(21) Appl. No.: 13/194,254

(22) Filed: Jul. 29, 2011

(65) Prior Publication Data

US 2012/0239319 A1 Sep. 20, 2012

Related U.S. Application Data

(60) Provisional application No. 61/453,164, filed on Mar. 16, 2011.

(51) Int. Cl.
*G01R 31/02* (2006.01)

(52) U.S. Cl.
USPC .............................. 702/58; 324/543

(58) Field of Classification Search
USPC ......... 702/57–59, 64, 65, 117, 120, 130, 132; 324/500, 509, 510, 512, 527, 528; 361/23–27, 31, 32, 78, 79, 86–88, 361/93.8, 115
See application file for complete search history.

(56) References Cited

U.S. PATENT DOCUMENTS

| | | | |
|---|---|---|---|
| 4,187,525 A | 2/1980 | Nagura et al. | |
| 4,511,835 A | 4/1985 | Studtmann | |
| 4,540,922 A | 9/1985 | Horvath et al. | |
| 4,689,712 A * | 8/1987 | Demeyer | 361/96 |
| 5,357,089 A | 10/1994 | Prentice | |
| 5,751,132 A | 5/1998 | Horvath et al. | |
| 5,821,742 A * | 10/1998 | Carr et al. | 324/74 |
| 5,914,582 A | 6/1999 | Takamoto et al. | |
| 5,923,135 A | 7/1999 | Takeda | |
| 6,331,941 B1 | 12/2001 | Smith | |
| 6,593,767 B1 | 7/2003 | Tanaka et al. | |
| 7,589,514 B1 | 9/2009 | Fernald | |
| 7,733,616 B2 * | 6/2010 | Yamada | 361/31 |
| 7,782,115 B2 | 8/2010 | Ochi | |
| 7,834,573 B2 | 11/2010 | Lindsey et al. | |
| 2004/0120090 A1 | 6/2004 | Galli et al. | |
| 2004/0125523 A1* | 7/2004 | Edwards et al. | 361/88 |

(Continued)

FOREIGN PATENT DOCUMENTS

WO   2009028837   3/2009

OTHER PUBLICATIONS

The International Search Report and the Written Opinion of the International Searching Authority, dated Jul. 11, 2012 (10 pages).

*Primary Examiner* — Manuel L Barbee (57) ABSTRACT

The system comprises a direct current bus having a positive terminal and a negative terminal. A first switching transistor and a second switching transistor have their respective switched terminals connected in series with respect to each other between the positive terminal and the negative terminal. A primary supply is arranged to generating a test voltage that is lower than an operational voltage of the direct current bus. The test voltage is applied between the positive terminal and the negative terminal of the direct current bus. A primary thermal circuit is associated with the supply for detecting whether the supply exceeds an operational temperature threshold. The thermal circuit provides a signal or logic level state indicative of a detected short circuit in the direct current bus if the primary supply exceeds the operational temperature threshold.

20 Claims, 2 Drawing Sheets

(56) References Cited

U.S. PATENT DOCUMENTS

| | | | |
|---|---|---|---|
| 2006/0247829 A1* | 11/2006 | Sato | 701/22 |
| 2009/0284999 A1 | 11/2009 | Gibbs et al. | |
| 2010/0060222 A1 | 3/2010 | Kezobo et al. | |

* cited by examiner

SYSTEM FOR DETECTING A SHORT CIRCUIT ASSOCIATED WITH A DIRECT CURRENT BUS

This document claims priority based on U.S. provisional application Ser. No. 61/453,164, filed on 16 Mar. 2011 and entitled SYSTEM FOR DETECTING A SHORT CIRCUIT ASSOCIATED WITH A DIRECT CURRENT BUS, under 35 U.S.C. 119(e).

FIELD OF THE INVENTION

This invention relates to system for detecting a short circuit associated with a direct current bus.

BACKGROUND

In the prior art, an inverter is used to convert a direct current voltage on a direct current data bus to one or more alternating current signals that control an electric motor. In certain prior art configurations, the inverter comprises one or more power switching semiconductors that may fail in an open state or a closed state. If one or more power switching semiconductors fail in a closed state, a short circuit may be established between the opposite polarity terminals of the direct current data bus or between a direct current terminal and a normally alternating current output of the inverter, which can damage a winding of the electric motor or other circuitry within the inverter. Thus, there is need to detect a short circuit in the direct current bus at a lower test voltage than the operational voltage of the inverter to minimize damage to the electric motor or the inverter.

SUMMARY OF THE INVENTION

In accordance with one embodiment, a system is capable of detecting a short circuit associated with a direct current bus. The system comprises a direct current bus having a positive terminal and a negative terminal. A first switching transistor and a second switching transistor have their respective switched terminals connected (or coupled) in series with respect to each other between the positive terminal and the negative terminal. A primary supply is arranged to generate a test voltage that is lower than an operational voltage of the direct current bus. The test voltage is applied between the positive terminal and the negative terminal of the direct current bus. A primary thermal circuit is associated with the supply for detecting whether the supply exceeds an operational temperature threshold. The thermal circuit provides a signal or logic level state indicative of a detected short circuit in the direct current bus if the primary supply exceeds the operational temperature threshold.

DESCRIPTION OF THE PREFERRED EMBODIMENT

Figure 1:
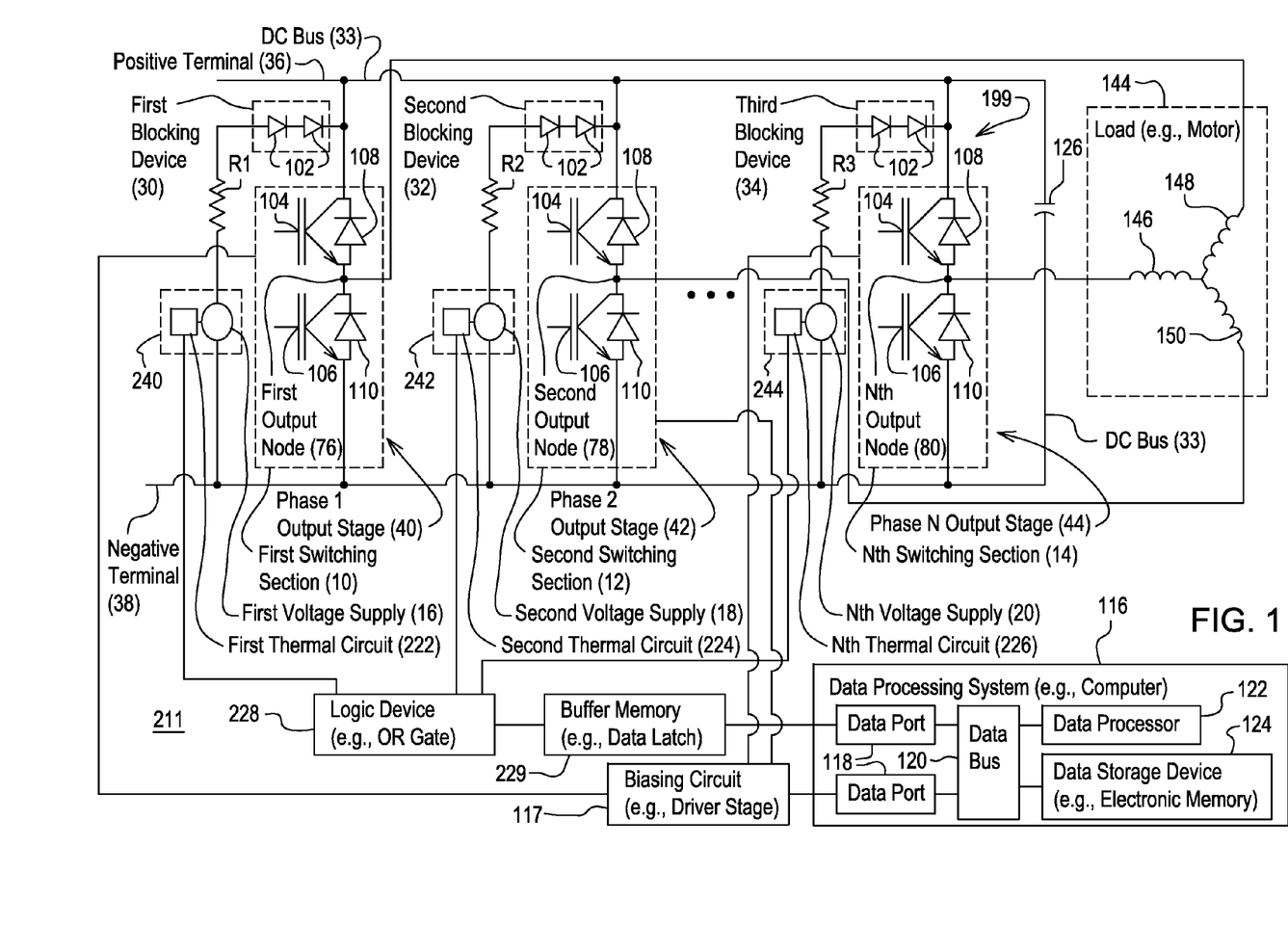
FIG. 1 is a block diagram of one embodiment of a system for detecting a short circuit associated with a direct current bus.

In accordance with one embodiment, FIG. 1 shows a system 211 that is capable of detecting a short circuit associated with a direct current bus 33. The system comprises a direct current bus 33 having a positive terminal 36 and a negative terminal 38. The inverter 199 may have one or more phases or subassemblies, where each phase or subassembly provides a separate output signal to a corresponding output terminal of the inverter 199. Each phase of the inverter 199 has a pair of switching transistors (104, 106), a corresponding voltage supply (16, 18, 20), and a corresponding thermal circuit (222, 224, 226). The switching transistors (104, 106) are configured to receive direct current power from the direct current bus 33. One or more output terminals of the inverter 199 are coupled to the load 144 (e.g., motor). The inverter 199 may control the switching transistors (104, 106) to modulate the output signal applied to the load 144 or motor, which supports the control of the rotational speed, torque, acceleration, deceleration, or rotational direction of the motor.

The output nodes (76, 78, 80) of the inverter phases may be coupled to the corresponding motor phase terminals of the motor. As illustrated in FIG. 1, the inverter 199 has N equal to three phases and the load 144 has three phases. Each phase of the load 144 is represented as an inductance or motor winding (146, 148, 150), for instance. Although the load 144 is shown as WYE configuration, the load 144 may be configured differently for signal phase, dual phase or other motor configurations.

A capacitor 126 is connected in parallel across the terminals (36, 38) of the direct current bus 33. The capacitor 126 may comprise an electrolytic capacitor, or a capacitor bank for filtering the direct current and keeping the voltage or current on the direct current bus 33 at a substantially uniform level or within a desired range of fluctuation (e.g., within tolerance for acceptable current ripple). For example, the capacitor 126 may reduce or ameliorate the fluctuation in the current of the direct current bus 33 that might otherwise occur when one or more semiconductor switches (104, 106) associated with one or more stages of the inverter 119 are active or switched on simultaneously or in rapid succession.

The outputs of one or more thermal circuits (222, 224, 226) are coupled to a logic device 228. In turn, the logic device 228 provides an output to buffer memory 229 (e.g., a data latch). The buffer memory 229 is coupled to an electronic data processing system 116 (e.g., computer).

Although the inverter 199 has three phases in FIG. 1, it is understood that the inverter 199 or system 211 may have any number of phases from 1 to N, where N is a positive whole number. As shown, the inverter 199 has a phase 1 output stage 40, a phase 2 output stage 42 and a phase N output stage 44. Any intermediate output stages between the phase 2 output stage 42 and the phase N output stage 44 are indicated by the three dots in FIG. 1. The phase 1 output stage 40 has a first switching section 10; the phase 2 output stage 42 has a second switching section 12; the phase N output stage 44 has an Nth switching section 14. Each phase of the inverter 199 comprises a first switching transistor 104 and a second switching transistor 106 with their respective switched terminals (e.g., collector and emitter, or source and drain) connected in series with respect to each other between the positive terminal 36 and the negative terminal 38. Although the first switching transistor 104 and the second switching transistor 106 are illustrated as NPN transistors, in an alternative embodiment the first switching transistor 104 and the second switching transistor 106 may comprise PNP transistors, field effect transistors, or other suitable semiconductor devices.

The first switching section 10 has inputs associated with the bases (or gates) of the first switching transistor 104 and the second switching transistor 106. The first switching section 10 has a first output node 76 coupled to the load 144 or a first winding 148 of the motor. The second switching section 12 has inputs associated with the bases (or gates) of the first switching transistor 104 and the second switching transistor 106. The second switching section 12 has a second output node 78 coupled to the load 144 or a second winding 150 of the motor. The Nth switching section 14 (e.g. third switching section) has an input associated with the base of the first switching transistor 104 and the second switching transistor 106. The Nth switching section 14 (e.g. third switching section) has an Nth output node 80 (e.g., third output node) coupled to the load 144 or a third winding 146 of the motor.

The base (or gate) of each first switching transistor 104 is coupled to a biasing network 117, a driver stage, or a logic circuit for providing a signal (e.g., modulating signal) to activate (e.g., switch on) and deactivate (e.g., switch off) the first switching transistor 104. Similarly, the base (or gate) of the second switching transistor 106 is coupled to the biasing network 117, the driver stage, or the logic circuit for providing a signal to activate (e.g., switch on) and deactivate (e.g., switch off) the second switching transistor 106.

As illustrated in FIG. 1, the collector of each first switching transistor 104 is coupled to one voltage rail or the positive terminal 36 of the direct current bus 33, whereas the emitter of the first switching transistor 104 is coupled to an output node (76, 78, 80) of the respective phase. The collector of each second switching transistor 106 is coupled to the output node (76, 78, 80) of the respective phase, whereas the emitter of the second switching transistor 106 is coupled to another voltage rail (of the direct current bus 33) or the negative terminal 38 of the direct current bus 33.

For the first phase, a first output node 76 is coupled to the load 144 or to a first winding 148 or first phase connection of the motor. For the second phase, a second output node 78 is coupled to the load 144 or a second phase connection or second winding 150 of the motor. For the third phase, a third output node is coupled to the load 144 or a third phase connection or third winding 146 of the motor.

A first protective diode 108 is connected in parallel between the collector and emitter of each first switching transistor 104. A second protective diode 110 is connected in parallel between the collector and emitter of each second switching transistor 106. The first protective diode 108 and the second protective diode 110 prevent transient currents from damaging the first switching transistor 104 and the second switching transistor 106, respectively, by providing a path for current to be dissipated when the first switching transistor 104 or the second switching transistor 106 is switched between states (e.g., or turned off).

A first detection module 240 comprises a first voltage supply 16 associated with a first thermal circuit 222; a second detection module 242 comprises a second voltage supply 18 associated with a second thermal circuit 224; a Nth detection module 244 (or third detection module) comprises an Nth voltage supply 20 associated with an Nth thermal circuit 226. Any of the foregoing thermal circuits may be integrated into the corresponding voltage supply.

A primary supply, or first voltage supply 16, is coupled between the positive terminal 36 and negative terminal 38 of the direct current bus 33. For example, the primary supply (or first voltage supply 16) has an output coupled to the positive voltage terminal 36 or positive rail of the positive DC bus node of the first switching section 10. The primary supply is placed in series with a resistor R1 and a first blocking device 30. In one embodiment, the resistor R1 comprises a current limiting resistor. The resistor R1 is placed in series with the supply to limit the current outputted by the first voltage supply 16. In one embodiment, the first blocking device 30 comprises one or more diodes 102 that individually, or collectively cascaded, block the flow of current from one voltage rail or the positive voltage terminal 36 of the direct current bus 33. The first blocking device 30 prevents current from the direct current bus 33 from flowing into the primary supply (or first voltage supply 16) and damaging it, for example.

The primary supply, or first voltage supply 16, is adapted to generate a test voltage that is lower than an operational voltage of the direct current bus 33. The test voltage applied between the positive terminal 36 and the negative terminal 38 of the direct current bus 33. For example, the test voltage may be less than or equal to approximately 25 Volts DC, whereas the operational voltage of the direct current data bus 120 may be greater than or equal to 75 Volts DC. For instance, the operational voltage of the direct current bus 33 is typically equal to or greater than 220 VDC; for an electrically propelled vehicle DC voltages of 300 VDC or 600 VDC are not unusual.

A primary thermal circuit, or first thermal circuit 222, is associated with the first voltage supply 16 for detecting whether the supply exceeds an operational temperature threshold. The first thermal circuit 222 provides a signal or logic level state indicative of a detected short circuit in the direct current bus 33 if the first voltage 16 supply exceeds the operational temperature threshold. The first thermal circuit 222 may comprise a thermistor or another device that provides a switching signal or digital output if the temperature (e.g., external package temperature or internal temperature) of the primary supply (16) exceeds the operational temperature threshold. In one embodiment, the operational temperature threshold may be set or programmed based on empirical tests, field tests, or experimentation to reliably identify a short circuit associated with the direct current bus 33 at least a majority of the time.

A secondary supply, or second voltage supply 18, is coupled between the positive and negative terminals 38 of the direct current bus 33. For example, the secondary supply has (or second voltage supply 18) an output coupled to the positive voltage terminal or positive rail of the positive DC bus node of the second switching section 12. The second voltage supply 18 is placed in series with a resistor R2 and a second blocking device 32. In one embodiment, the resistor R2 comprises a current limiting resistor. The resistor R2 is placed in series with the second voltage supply 18 to limit the current outputted by the second voltage supply 18. In one embodiment, the second blocking device 32 comprises one or more diodes 102 that individually, or collectively cascaded, block the flow of current from one voltage rail or the positive voltage terminal 36 of the direct current bus 33. The second blocking device 32 prevents current from the direct current data bus 120 from flowing into the second voltage supply 18 and damaging it, for example.

The secondary supply, or second voltage supply 18, is adapted to generate a test voltage that is lower than an operational voltage of the direct current bus 33. The test voltage applied between the positive terminal 36 and the negative terminal 38 of the direct current bus 33. For example, the test voltage may be less than or equal to approximately 25 Volts DC, whereas the operational voltage of the direct current bus 33 may be greater than or equal to 75 Volts DC. For instance, the operational voltage of the direct current data bus 120 is typically equal to or greater than 220 VDC; for an electrically propelled vehicle DC voltages of 300 VDC or 600 VDC are not unusual.

A secondary thermal circuit, or second thermal circuit 224, is associated with the supply for detecting whether the supply exceeds an operational temperature threshold. The second thermal circuit 224 provides a signal or logic level state indicative of a detected short circuit in the direct current bus 33 if the second voltage supply 18 exceeds the operational temperature threshold. The thermal circuit may comprise a thermistor or another device that provides a switching signal or digital output if the temperature (e.g., external package temperature or internal temperature) of the secondary supply exceeds the operational temperature threshold. In one embodiment, the operational temperature threshold may be set or programmed based on empirical tests, field tests, or experimentation to reliably identify a short circuit associated with the direct current bus 33 at least a majority of the time.

An Nth supply, or Nth voltage supply 20, is coupled between the positive terminal 36 and negative terminal 38 of the direct current bus 33. For example, the Nth voltage supply 20 has an output coupled to the positive voltage terminal 36 or positive rail of the positive DC bus node of the Nth switching section 14. The Nth voltage supply 20 is placed in series with a resistor R3 and an Nth blocking device 34 (e.g., third blocking device). In one embodiment, the resistor R3 comprises a current limiting resistor. The resistor R3 is placed in series with the Nth voltage supply 20 to limit the current outputted by the Nth voltage supply 20. In one embodiment, the Nth blocking device 34 comprises one or more diodes 102 that individually, or collectively cascaded, block the flow of current from one voltage rail or the positive voltage terminal 36 of the direct current bus 33. The third blocking device 34 prevents current from the direct current bus 33 from flowing into the Nth supply 20 and damaging it, for example.

The Nth supply, or Nth voltage supply 20, is adapted to generate a test voltage that is lower than an operational voltage of the direct current bus 33. The test voltage applied between the positive terminal 36 and the negative terminal 38 of the direct current bus 33. For example, the test voltage may be less than or equal to approximately 25 Volts DC, whereas the operational voltage of the direct current data bus 120 may be greater than or equal to 75 Volts DC. For instance, the operational voltage of the direct current bus 33 is typically equal to or greater than 220 VDC; for an electrically propelled vehicle DC voltages of 300 VDC or 600 VDC are not unusual.

An Nth thermal circuit 226 is associated with the Nth voltage supply 20 for detecting whether the supply exceeds an operational temperature threshold. The Nth thermal circuit 226 provides a signal or logic level state indicative of a detected short circuit in the direct current bus 33 if the supply exceeds the operational temperature threshold. The Nth thermal circuit 326 may comprise a thermistor or another device that provides a switching signal or digital output if the temperature (e.g., external package temperature or internal temperature) of the Nth voltage supply 20 exceeds the operational temperature threshold. In one embodiment, the operational temperature threshold may be set or programmed based on empirical tests, field tests, or experimentation to reliably identify a short circuit associated with the direct current bus 33 at least a majority of the time.

The outputs of the thermal circuits (e.g., the first thermal circuit 222, the second thermal circuit 224 and the Nth thermal circuit 226) are coupled to the logic device 228. In one example, in one arrangement the logic device 228 may comprise a multiple input OR gate to detect a short circuit in a single phase of the inverter 199. In another example, the logic device 228 may comprise a non-exclusive OR gate, such that a failure of all phases of the inverter does not result in a negative indication of failure. In another example, the logic device 228 may have multiple inputs and output configurations that correspond to failure of specific semiconductor devices, transistors, or diodes within the inverter.

The logic device 228 is coupled to buffer memory 229. The buffer memory 229 may store, or store and time stamp, output of the logic device 228. The buffer memory 229 may store the output of the logic device 228 in a first-in, first-out (FIFO) stack, a first-in, last-out (LIFO) stack, in an array of shift registers or otherwise. In an alternate embodiment, the buffer memory 229 may comprise a data latch or a group of flip flops (e.g., D flip flops or resettable flip flops) to store or hold the output of the logic device 228, until it is read by the data processing system 116.

In one embodiment, the buffer memory 229 is coupled to the electronic data processing system 116 (e.g., computer). The electronic data processing system 116 comprises a data processor 122, a data storage device 124 and one or more data ports 118 coupled to a data bus 120. The data processor 122, the data storage device 124 and the data port 118 are capable of communicating with one another via the data bus 120.

The data processor 122 may comprise a microprocessor, a microcontroller, a logic device, an arithmetic logic unit, an application specific integrated circuit, a programmable logic array, or another programmable electronic device.

The data storage device 124 may comprise electronic memory, random access memory, non-volatile memory, a magnetic storage device, an optical storage device, or any other suitable device or medium for storing data. Each data port 118 may comprise an input/output port, a transceiver, or another device for transmitting to, receiving from, or communicating with electronic devices via a transmission line or otherwise.

The data ports 118 may be coupled to the buffer memory 229 or a data latch to facilitate the data processing system's receipt of a data message, or thermally triggered data message or signal. The biasing circuit 117 may be coupled to the data port 118 such that the data processing system 116 can generate a command or outgoing signal to disable or enable the biasing circuit 117 or driver stage; hence, control the disabling or enabling of the inverter to prevent damage to the non-faulty inverter circuitry or the load 144 (e.g., motor).

In one configuration, the electronic processing system 116 is capable of disabling operation of the inverter 199 in an operational mode at the operational voltage level if the thermal circuit provides the signal or logic level during a test mode at the test voltage level. In another configuration, the electronic data processing system 116 has a user interface (not shown) coupled to the data bus 120 for providing diagnostic information indicative of the location or identity of a faulty semiconductor device or short circuit in the inverter 199. In another configuration, in a test mode the data processing system 116 generates test signals to instruct the biasing circuit 117 or driver to selectively activate the first switching transistor 104 or the second switching transistor 106 of the first switching section 10, the second switching section 12, or the Nth switching section 14 (e.g. third switching section) such that a short circuit can be identified within the switching section or the inverter. For example, if the first switching transistor 104 or the second switching transistor 106 of any switching section fails in a closed state, a short circuit across the direct current bus 33 can be established by activating the companion (e.g., opposite) switching transistor in the same switching section. Therefore, the data storage device 124 may store a test sequence (of transistor activation commands for the biasing circuit 117) in which each switching transistor is activated for a period of time sufficient to trigger detection of a short circuit by a corresponding thermal circuit.

In an alternate embodiment, the user interface (not show) may be coupled to the data bus 120. The user interface may comprise a display, a keypad, a keyboard, a pointing device, or another data input and data output device for entering or monitoring data (e.g., diagnostic data) associated with the inverter via the data processing system 116.

The system of FIG. 1 is capable of detecting a short circuit associated with the direct current bus 33 under a wide variety of illustrative examples.

Under a first example, if the first switching transistor 104 and the second switching transistor 106 for any phase both fail in the closed state or active state, a short circuit will be formed across the direct current bus 33. Under a second example, if the first protective diode 108 and the second protective diode 110 for any phase both fail in the closed state, a short circuit will be formed across the direct current bus 33. Under a third example, if the first protective diode 108 and the second switching transistor 106 fail in the closed state or the active state, a short circuit will be formed across the direct current bus 33. Under a fourth example, if the second protective diode 110 and the first switching transistor 104 both fail in the closed state or the active date, a short circuit will be formed across the direct current bus 33.

Under a fifth example, if the first switching transistor 104 or the second switching transistor 106 fail in a closed stated or active state, direct current of one polarity (e.g., positive polarity) may be applied to a winding (128, 146, 150) of the motor or the load 144. The direct current applied to the winding tends to seek a path to direct current of opposite potential or ground potential which can potentially lead to damage to the load 144, the motor or the inverter. Under a sixth example, if the first protective diode 108 or the second protective diode 110 fail in a closed stated or active state, direct current of one polarity (e.g., positive polarity) may be applied to a winding of the motor or the load 144. The direct current applied to the winding tends to seek a path to direct current of opposite potential or ground potential which can potentially lead to damage to the load 144, the motor or the inverter 199. If any of the above examples occur, the thermal circuit should trigger or trip a threshold temperature once the supply has provided a higher than normal output current over a time period that causes an increase in the external temperature of the supply (16, 18, 20). In one embodiment, the supply (16, 18, 20) for a particular phase could be activated individually or collectively with the other supplies. Because all of the supplies (16, 18, 20) are connected in parallel, greater current is available when all of the suppliers are operating simultaneously and the thermal circuit might be tripped or triggered more rapidly with the greater level of current available than a single supply.

In one embodiment, the switched terminals of the semiconductor comprise a collector and emitter; a first protective diode 108 is connected in parallel between the collector and emitter of the first switching transistor 104 and a second protective diode 110 is connected in parallel between the collector and emitter of the first switching transistor 104.

In one configuration, the biasing circuit 117 is configured to turn on at least one of the first switching transistor 104 and the second switching transistor 106, such that the short circuit of the first switching transistor 104 failing in a closed state is detected when the second switching transistor 106 is activated in the closed state. The data processing system 116 may control the biasing circuit 117 via an additional data port 118 of the data processing system 116 to turn on or off any transistor for any phase in a test mode of the inverter 119. In another configuration, the biasing circuit 117 is configured to turn on at least one of the first switching transistor 104 and the second switching transistor 106, such that the short circuit of the second switching transistor 106 failing in a closed state is detected when the first switching transistor 104 is activated in the closed state.

In one embodiment, the first phase may be associated with a first switching transistor 104 and a second switching transistor 106, whereas the second phase may be associated with a third switching transistor and a fourth switching transistor. The third switching transistor and a fourth switching transistor have their respective switched terminals connected in series with respect to each other between the positive terminal 36 and the negative terminal 38 of the direct current bus 33.

Although the first switching transistor 104 may be substantially similar to the third switching transistor and the second switching transistor 106 may be substantially similar to the fourth switching transistor, it is possible to use different configurations or specifications for the switching transistors within different phases, such as using NPN transistors in one phase and PNP transistors in another phase. Further, the semiconductors might differ from each other to match the impedance of certain windings of the load 144 or motor, or to provide certain redundancy in case of failure of certain components.

In one configuration, a secondary supply is adapted to generate a test voltage that is lower than an operational voltage of the direct current bus 33. The test voltage applied between the positive terminal 36 and the negative terminal 38 of the direct current bus 33. A secondary thermal circuit is associated with the supply for detecting whether the supply exceeds an operational temperature threshold. The secondary thermal circuit provides a signal or logic level state indicative of a detected short-circuit in the direct current bus 33 if the supply exceeds the operational temperature threshold. A logic device 228 is arranged for accepting the signal or logic level from the primary thermal circuit and the secondary thermal circuit. A data processing system 116 is coupled to the logic device 228 for processing the logic signal or logic level to provide diagnosis of a short circuit of a semiconductor in an inverter based on the states of the semiconductor devices in the inverter and the thermal state of the thermal circuits.

Figure 2:
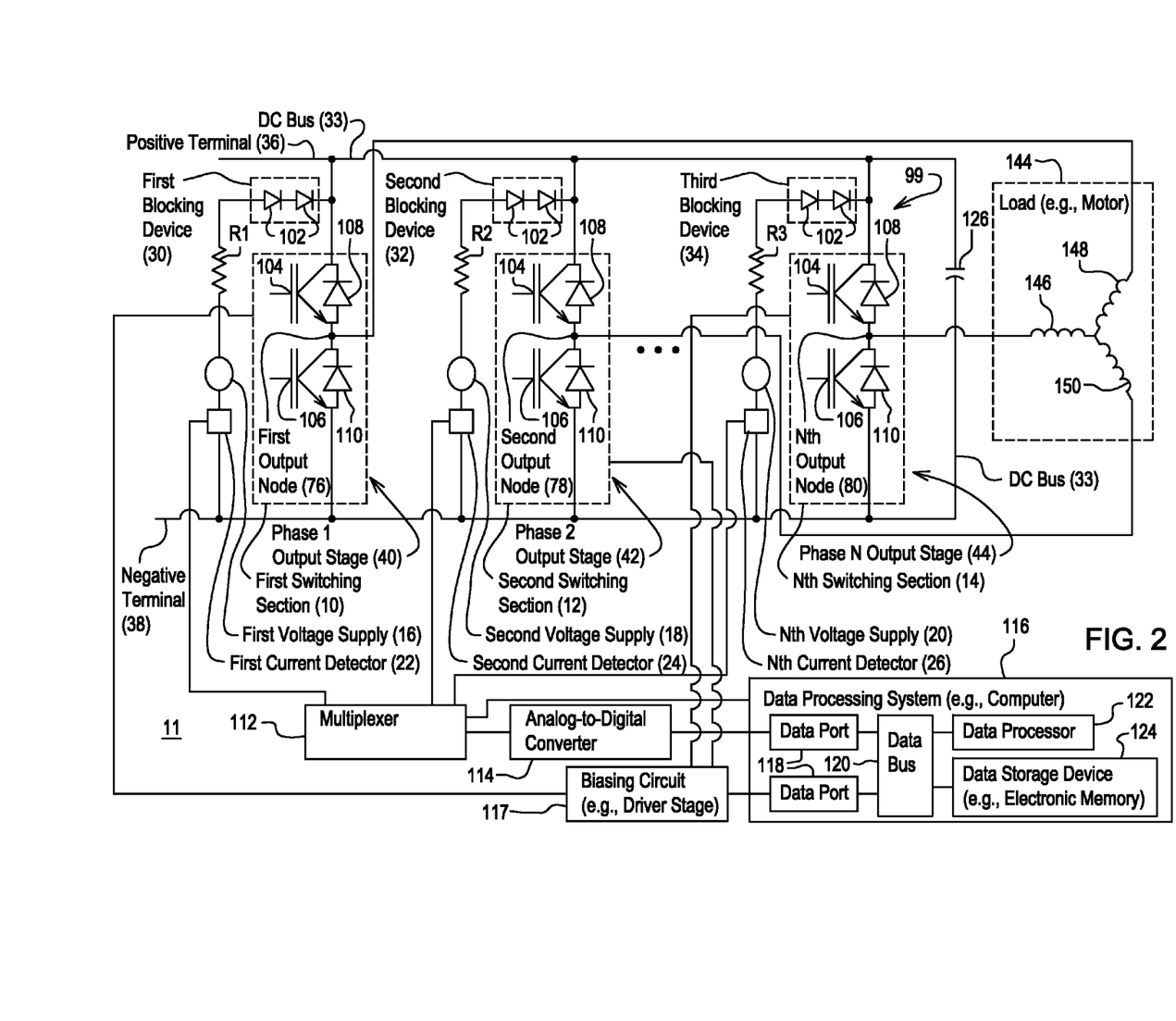
FIG. 2 is a block diagram of another embodiment of a system for detecting a short circuit associated with a direct current bus.

The system of FIG. 2 is similar to the system of FIG. 1, except the system of FIG. 2 replaces the thermal circuit (222, 224, 226) with a current detector (22, 24, 26). Further, the logic device 228 and the buffer memory 229 of FIG. 1 are deleted and a multiplexer 112 and analog-to-digital converter 114 is added in FIG. 2. Like reference numbers in FIG. 1 and FIG. 2 indicate like elements.

The phase 1 output stage 40 comprises a first current detector 22 associated with the primary supply, or the first voltage supply 16. The phase 2 output stage 42 comprises a second current detector 24 associated with the secondary supply, or the second voltage supply 18. The Nth output stage comprises an Nth current detector 26 associated with an Nth voltage supply 20.

Each current detector (22, 24, 26) may comprise a comparator, a current comparator, a voltage comparator, or another device for measuring the current that flows into or from the corresponding supply (16, 18, 20). In one embodiment, each current detector (22, 24, 26) is coupled in series with one terminal of the supply (16, 18, 20) or the current detector (22, 24, 26) is electromagnetically coupled to one terminal of the supply via an inductive probe or coil. In one configuration, the current detector (22, 24, 26) may comprise a current comparator where a reference current input is compared to a measured current supplied by an inductive probe or a series connection to the supply via a resistive voltage divider. The output of each current detector may change logical state if the current detected by the current detector (22, 24, 26) exceeds a maximum threshold current indicative of a short circuit.

The logical state or signal output of each current detector (22, 24, 26) may be coupled to a multiplexer 112. The multiplexer 112 allows the data processor 122 to select an output from any one of the current detectors associated with the phase 1 output stage 40 (i.e., first phase), the phase 2 output stage 42 (i.e., second phase), or the stage N output phase (i.e., Nth phase). For example, the multiplexer 112 may serially select the outputs from the each phase on a round robin, serial or scanning basis. The use of the multiplexer 112 may allow the use of single input analog to digital converter, as opposed to using a dedicated analog to digital converter for each corresponding current detector.

The input of the analog-to-digital converter 114 is coupled to the multiplexer 112, whereas the output of the analog-to-digital converter 114 is coupled to the data processing system 116. In one embodiment, the data processing system 116 is configured to disable operation of the inverter in an operational mode if the current detection circuit (22, 24, 26) provides the signal or logic level during a test mode. For example, the data processing system 116 may be programmed with software instructions to disable operation of the inverter in the operational mode of the current detection circuit provides the signal or logic level during a test mode that is indicative of a short circuit associated with the data bus 120 to prevent damage to the electronics of the system 115.

The data ports 118 may be coupled to analog-to-digital converter 114 to facilitate the data processing system's receipt of a data message, or excess current data message or signal. The biasing circuit 117 may be coupled to the data port 118 such that the data processing system 116 can generate a command or outgoing signal to disable or enable the biasing circuit 117 or driver stage; hence, control the disabling or enabling of the inverter 99 in response to the exceeding of the threshold current.

In one configuration, the electronic processing system 116 is capable of disabling operation of the inverter 99 in an operational mode at the operational voltage level if the current detector provides the signal or logic level during a test mode at the test voltage level. In another configuration, the electronic data processing system 116 has a user interface coupled to the data bus 120 for providing diagnostic information indicative of the location or identity of a faulty semiconductor device or short circuit. In another configuration, in a test mode the data processing system 116 generates test signals to instruct the biasing circuit 117 or driver to selectively activate the first switching transistor 104 or the second switching transistor 106 of the first switching section 10, the second switching section 12, or the Nth switching section 14 (e.g. third switching section) such that a short circuit can be identified within the switching section or the inverter 99. For example, if the first switching transistor 104 or the second switching transistor 106 of any switching section fails in a closed state, a short circuit across the direct current bus 33 can be established by activating the companion (e.g., opposite) switching transistor in the same switching section. Therefore, the data storage device 124 may store a test sequence (of transistor activation commands for the biasing circuit 117) in which each switching transistor is activated for a period of time sufficient to trigger detection of a short circuit by a corresponding current detector.

In an alternate embodiment, the user interface (not shown) may be coupled to the data bus 120. The user interface may comprise a display, a keypad, a keyboard, a pointing device, or another data input and data output device for entering or monitoring data (e.g., diagnostic data) associated with the inverter via the data processing system 116.

The system of FIG. 2 is capable of detecting a short circuit associated with the direct current bus 33 under a wide variety of illustrative examples.

Under a first example, if the first switching transistor 104 and the second switching transistor 106 for any phase both fail in the closed state or active state, a short circuit will be formed across the direct current bus 33. Under a second example, if the first protective diode 108 or the second protective diode 110 for any phase fail in the closed state, a short circuit will be formed across the direct current bus 33. Under a third example, if the first protective diode 108 and the second switching transistor 106 both fail in the closed state or the active state, a short circuit will be formed across the direct current bus 33. Under a fourth example, if the second diode and the first switching transistor 104 both fail in the closed state or the active date, a short circuit will be formed across the direct current bus 33.

Under a fifth example, if the first switching transistor 104 or the second switching transistor 106 fail in a closed stated or active state, direct current of one polarity (e.g., positive polarity) may be applied to a winding (146, 148, 150) of the motor or the load 144. The direct current applied to the winding tends to seek a path to direct current of opposite potential or ground potential which can potentially lead to damage to the load 144, the motor or the inverter. Under a sixth example, if the first protective diode 118 or the second protective diode 110 fail in a closed stated or active state, direct current of one polarity (e.g., positive polarity) may be applied to a winding (146, 148, 150) of the motor or the load 144. The direct current applied to the winding tends to seek a path to direct current of opposite potential or ground potential which can potentially lead to damage to the load 144, the motor or the inverter. If any of the above examples occur, the current detector (22, 24, 26) should trigger or trip a threshold current once the respective supply (16, 18, 20) has provided a higher than normal output current. In one embodiment, the supply for a particular phase could be activated individually or collectively with the other supplies. Because all of the supplies are connected in parallel, greater current is available when all of the suppliers are operating simultaneously and the current detector might be tripped or triggered more rapidly with the greater level of current available than a single supply.

In FIG. 2, a secondary supply, or second voltage supply 18, may be configured to generate a test voltage that is lower than an operational voltage of the direct current bus 33. The secondary supply (18) applies the test voltage between the positive terminal 36 and the negative terminal 38 of the direct current bus 33. A secondary current detection circuit 24 is associated with the supply (18) for detecting whether the supply (18) exceeds an operational current threshold. The secondary current detection circuit provides a signal or logic level state indicative of a detected short circuit in the direct current bus 33 if the supply (18) exceeds the operational current threshold.

The multiplexer 112 accepts the signal or logic level from the primary current detection circuit and the secondary current detection circuit. The data processing system 116 is coupled to the multiplexer 112 for processing the logic signal or logic level to provide diagnosis of a short circuit of a semiconductor in an inverter based on the states of the semiconductor devices in the inverter and the thermal state of the current detection circuits.

Having described the preferred embodiment, it will become apparent that various modifications can be made without departing from the scope of the invention as defined in the accompanying claims.

The following is claimed:

1. A system for detecting a short circuit associated with a direct current bus, the system comprising:
   a direct current bus having a positive terminal and a negative terminal;
   a first switching transistor and a second switching transistor with their respective switched terminals connected in series with respect to each other between the positive terminal and the negative terminal;
   a biasing network for providing signals the first switching transistor and the second switching transistor, wherein during a test mode the first switching transistor, the second switching transistor, or both are selectively activated such that a detected short circuit may be identified within a switching section that comprises the first switching transistor and the second switching transistor;
   a primary supply for generating a test voltage that is lower than an operational voltage of the direct current bus in an operational mode, during the test mode the test voltage applied between the positive terminal and the negative terminal of the direct current bus;
   a primary thermal circuit associated with the primary supply for detecting whether the primary supply exceeds an operational temperature threshold, the primary thermal circuit providing a signal or logic level state indicative of the detected short circuit in the direct current bus or in the switching section if the primary supply exceeds the operational temperature threshold; and
   a first blocking device coupled between one of the terminals of the direct current bus and the primary supply, the first blocking device preventing a flow of current from the direct current bus into the primary supply.

2. The system according to claim 1 wherein the switched terminals comprise a collector and emitter; a first diode being connected in parallel between the collector and emitter of the first switching transistor and a second diode being connected in parallel between the collector and emitter of the second switching transistor.

3. The system according to claim 2 wherein the detected short circuit comprises the first diode and the second diode failing in a closed state.

4. The system according to claim 1 wherein the detected short circuit comprises the first switching transistor and the second switching transistor failing in their respective closed states.

5. The system according to claim 1 further comprising:
   the biasing circuit to turn on at least one of the first switching transistor and the second switching transistor, such that the short circuit of the first switching transistor failing in an closed state is detected when the second switching transistor is activated in the closed state.

6. The system according to claim 1 further comprising:
   the biasing circuit to turn on at least one of the first switching transistor and the second switching transistor, such that the short circuit of the second switching transistor failing in an closed state is detected when the first switching transistor is activated in the closed state.

7. The system according to claim 1 wherein a resistor is placed in series with the supply to limit the current outputted by the primary supply.

8. The system according to claim 1 further comprising:
   a third switching transistor and a fourth switching transistor with their respective switched terminals connected in series with respect to each other between the positive terminal and the negative terminal, a second switching section comprising the third switching transistor and the fourth switching transistor;
   a secondary supply for generating a test voltage that is lower than an operational voltage of the direct current bus, the test voltage applied between the positive terminal and the negative terminal of the direct current bus;
   a secondary thermal circuit associated with the supply for detecting whether the supply exceeds an operational temperature threshold, the secondary thermal circuit providing a signal or logic level state indicative of a detected short-circuit in the direct current bus or in the second switching section of an inverter if the supply exceeds the operational temperature threshold; and
   a logic device for accepting the signal or logic level from the primary thermal circuit and the secondary thermal circuit;
   a data processing system coupled to the logic device for processing the logic signal or logic level to provide diagnosis of a short circuit of a semiconductor in the inverter based on the states of the semiconductor devices in the inverter and the thermal state of the thermal circuits.

9. The system according to claim 8 further comprising:
   disabling operation of the inverter in an operational mode at the operational voltage level if the thermal circuit provides the signal or logic level during a test mode at the test voltage level.

10. The system according to claim 1 wherein the first blocking device comprises two diodes that are cascaded or in series with each other.

11. A system for detecting a short circuit associated with a direct current bus, the system comprising:
    a direct current bus having a positive terminal and a negative terminal;
    a first switching transistor and a second switching transistor with their respective switched terminals connected in series with respect to each other between the positive terminal and the negative terminal;
    a biasing network for providing signals to the first switching transistor and the second switching transistor, wherein during a test mode the first switching transistor, the second switching transistor, or both are selectively activated such that a detected short circuit may be identified within a switching section that comprises the first switching transistor and the second switching transistor;
    a primary supply for generating a test voltage that is lower than an operational voltage of the direct current bus in an operational mode, during the test mode the test voltage applied between the positive terminal and the negative terminal of the direct current bus;
    a primary current detection circuit associated with the primary supply for detecting whether the primary supply exceeds an operational current threshold, the primary current detection circuit providing a signal or logic level state indicative of the detected short circuit in the direct current bus or in the switching section if the supply exceeds the operational current threshold; and
    a first blocking device coupled between one of the terminals of the direct current bus and the primary supply, the first blocking device preventing a flow of current from the direct current bus into the primary supply.

12. The system according to claim 11 wherein the switched terminals comprise a collector and emitter; a first diode being connected in parallel between the collector and emitter of the first switching transistor and a second diode being connected in parallel between the collector and emitter of the second switching transistor.

13. The system according to claim 12 wherein the detected short circuit comprises the first diode and the second diode failing in a closed state.

14. The system according to claim 11 wherein the detected short circuit comprises the first switching transistor and the second switching transistor failing in their respective closed states.

15. The system according to claim 11 further comprising:
the biasing circuit to turn on at least one of the first switching transistor and the second switching transistor, such that the short circuit of the first switching transistor failing in an closed state is detected when the second switching transistor is activated in the closed state.

16. The system according to claim 11 further comprising:
the biasing circuit to turn on at least one of the first switching transistor and the second switching transistor, such that the short circuit of the second switching transistor failing in an closed state is detected when the first switching transistor is activated in the closed state.

17. The system according to claim 11 wherein a resistor is placed in series with the supply to limit the current outputted by the primary supply.

18. The system according to claim 11 further comprising:
a third switching transistor and a fourth switching transistor with their respective switched terminals connected in series with respect to each other between the positive terminal and the negative terminal;
a secondary supply for generating a test voltage that is lower than an operational voltage of the direct current bus, the test voltage applied between the positive terminal and the negative terminal of the direct current bus;
a secondary current detection circuit associated with the supply for detecting whether the supply exceeds an operational current threshold, the secondary current detection circuit providing a signal or logic level state indicative of a detected short circuit in the direct current bus if the supply exceeds the operational current threshold; and
a multiplexer for accepting the signal or logic level from the primary current detection circuit and the secondary current detection circuit;
a data processing system coupled to the multiplexer for processing the logic signal or logic level to provide diagnosis of a short circuit of a semiconductor in an inverter based on the states of the semiconductor devices in the inverter and the thermal state of the current detection circuits.

19. The system according to claim 18 further comprising:
disabling operation of the inverter in an operational mode if the current detection circuit provides the signal or logic level during a test mode.

20. The system according to claim 11 wherein the first blocking device comprises two diodes that are cascaded or in series with each other.

* * * * *